(12) United States Patent
Chen et al.

(10) Patent No.: US 10,510,296 B2
(45) Date of Patent: Dec. 17, 2019

(54) PIXEL DRIVING CIRCUIT AND PIXEL DRIVING METHOD, ARRAY SUBSTRATE AND DISPLAY DEVICE

(71) Applicants: Boe Technology Group Co., Ltd., Beijing (CN); Hefei Xinsheng Optoelectronics Technology Co., Ltd., Hefei, Anhui (CN)

(72) Inventors: Mo Chen, Beijing (CN); Xiong Xiong, Beijing (CN); Jilei Gao, Beijing (CN); Songmei Sun, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 21 days.

(21) Appl. No.: 15/740,300

(22) PCT Filed: Jun. 28, 2017

(86) PCT No.: PCT/CN2017/090442
§ 371 (c)(1),
(2) Date: Dec. 27, 2017

(87) PCT Pub. No.: WO2018/049866
PCT Pub. Date: Mar. 22, 2018

(65) Prior Publication Data
US 2018/0315376 A1    Nov. 1, 2018

(30) Foreign Application Priority Data

Sep. 14, 2016 (CN) .......................... 2016 1 0825369

(51) Int. Cl.
*G09G 3/3258* (2016.01)
*G09G 3/3266* (2016.01)
(Continued)

(52) U.S. Cl.
CPC ......... *G09G 3/3258* (2013.01); *G09G 3/3233* (2013.01); *G09G 3/3266* (2013.01);
(Continued)

(58) Field of Classification Search
CPC .. G09G 3/3233; G09G 3/3258; G09G 3/3266; G09G 2300/0809;
(Continued)

(56) References Cited

U.S. PATENT DOCUMENTS

2005/0259703 A1* 11/2005 You ..................... G09G 3/3233
372/38.07
2008/0180364 A1* 7/2008 Kim .................... G09G 3/3233
345/76
(Continued)

FOREIGN PATENT DOCUMENTS

CN    101231822 A    7/2008
CN    101937647 A    1/2011
(Continued)

OTHER PUBLICATIONS

International Search Report received for PCT Patent Application No. PCT/CN2017/090442, dated Aug. 29, 2017, 6 pages (2 pages of English Translation and 4 pages of Original Document).
(Continued)

*Primary Examiner* — Nelson M Rosario
(74) *Attorney, Agent, or Firm* — Womble Bond Dickinson (US) LLP

(57) ABSTRACT

Disclosed is a pixel driving circuit, comprising a driving control circuit, a first driving circuit and a second driving circuit. The driving control circuit is configured to control one of the first driving circuit and the second driving circuit to be turned on under the condition the first scanning line outputs an effective voltage signal, and control the other of the first driving circuit and the second driving circuit to be
(Continued)

turned on under the condition the second scanning line outputs an effective voltage signal. The first driving circuit is configured to drive the light emitting circuit to emit light under control of the driving control circuit. The second driving circuit is configured to drive the light emitting circuit to emit light under control of the driving control circuit.

15 Claims, 6 Drawing Sheets

(51) Int. Cl.
*G09G 3/3233* (2016.01)
*H01L 27/32* (2006.01)
*G09G 3/3291* (2016.01)

(52) U.S. Cl.
CPC ....... *H01L 27/3244* (2013.01); *G09G 3/3291* (2013.01); *G09G 2300/0809* (2013.01); *G09G 2310/0278* (2013.01)

(58) Field of Classification Search
CPC ... G09G 2300/0819; G09G 2300/0852; G09G 2310/0262; G09G 2310/0278; G09G 2320/043; G09G 3/3291; H01L 27/3244
See application file for complete search history.

(56) References Cited

U.S. PATENT DOCUMENTS

| | | | |
|---|---|---|---|
| 2009/0079725 | A1 | 3/2009 | Saito et al. |
| 2009/0096725 | A1 | 4/2009 | Kretz et al. |
| 2016/0189604 | A1* | 6/2016 | Hu ...................... G09G 3/3225 345/215 |

FOREIGN PATENT DOCUMENTS

| | | |
|---|---|---|
| CN | 102054436 A | 5/2011 |
| CN | 104021763 A | 9/2014 |
| KR | 10-2009-0006129 | 1/2009 |

OTHER PUBLICATIONS

Written Opinion received for PCT Patent Application No. PCT/CN2017/090442, dated Aug. 29, 2017, 7 pages (4 pages of English Translation and 3 pages of Original Document).
Office Action received for Korean Patent Application No. 10-2018-7003397, dated Jan. 22, 2019, 12 pages (6 pages of English Translation and 6 pages of Office Action).
International Preliminary Report on Patentability received for PCT Patent Application No. PCT/CN2017/090442, dated Mar. 28, 2019, 10 pages (6 pages of English Translation and 4 pages of Original Document).

* cited by examiner

PIXEL DRIVING CIRCUIT AND PIXEL DRIVING METHOD, ARRAY SUBSTRATE AND DISPLAY DEVICE

CROSS REFERENCE TO RELATED APPLICATIONS

The present application is the U.S. national phase entry of PCT/CN2017/090442, with an international filing date of Jun. 28, 2017, which claims priority of the Chinese patent application No. 201610825369.5 filed on Sep. 14, 2016, the entire disclosure of which is incorporated herein by reference as a part of the present application.

TECHNICAL FIELD

This disclosure relates to the field of display technology, and more particularly, to an OLED pixel driving circuit and a pixel driving method, an array substrate and a display device.

BACKGROUND

With the development of display technology, a new generation of organic light emitting diode (OLED) display devices have advantages such as a lower manufacture cost, a higher reaction speed, a higher contrast, a wider visual angle, a larger range of working temperature, requiring no backlight unit, being bright-colored and having light weight as compared with conventional liquid crystal display (LCD) devices. Hence, the OLED display technology has become the fastest growing display technology at present.

A main development direction of the current OLEDs is to control the current between the source and the drain of the driving transistor by changing the gate voltage of the driving transistor that drives the OLED to emit light directly, so as to realize variation of the light emitting brightness. In this way, the driving transistor will be in the working state for a long time, i.e., the gate thereof keeps in a positive voltage or negative voltage state all the time. The existing thin film transistors (TFTs) of different materials generally have characteristic such as the threshold voltage Vth and the mobility thereof vary with the passage of time under DC bias (the varying trends of the positive voltage and the negative voltage are opposite). Therefore, after the OLED display panel works for a period of time, phenomena such as variation in gray scale brightness and non-uniform gray scale (caused by different variations of the characteristics of different TFTs) may come up easily.

SUMMARY

According to a first aspect of this disclosure, a pixel driving circuit is provided. The pixel driving circuit comprises a driving control circuit, a first driving circuit and a second driving circuit. The driving control circuit is connected to a data line, a first scanning line, a second scanning line, and a first voltage signal terminal, Also, the driving control circuit is connected to a first driving circuit via a first node, and is connected to a second driving circuit via a second node. Besides, the driving control circuit is configured to control one of the first driving circuit and the second driving circuit to be turned on under the condition the first scanning line outputs an effective voltage signal, and control the other of the first driving circuit and the second driving circuit to be turned on under the condition the second scanning line outputs an effective voltage signal. The first driving circuit is connected to the driving control circuit, a second voltage signal terminal and a light emitting circuit, and is configured to drive the light emitting circuit to emit light under control of the driving control circuit. The second driving circuit is connected to the driving control circuit, the second voltage signal terminal and the light emitting circuit, and is configured to drive the light emitting circuit to emit light under control of the driving control circuit.

In an embodiment of this disclosure, the first scanning line and the second scanning line output an effective voltage signal alternately.

In an embodiment of this disclosure, the driving control circuit comprises: a first transistor, a second transistor, a third transistor, a fourth transistor, a first capacitor and a second capacitor. A control terminal of the first transistor is coupled to the first scanning line, a first terminal of the first transistor is coupled to the data line, and a second terminal of the first transistor is coupled to the first node. A control terminal of the second transistor is coupled to the second scanning line, a first terminal of the second transistor is coupled to the data line, and a second terminal of the second transistor is coupled to the second node. A control terminal of the third transistor is coupled to the second scanning line, a first terminal of the third transistor is coupled to the first voltage signal terminal, and a second terminal of the third transistor is coupled to the first node. A control terminal of the fourth transistor is coupled to the first scanning line, a first terminal of the fourth transistor is coupled to the first voltage signal terminal, and a second terminal of the fourth transistor is coupled to the second node. A first terminal of the first capacitor is coupled to the first node, and a second terminal of the first capacitor is coupled to a second terminal of the second capacitor. A first terminal of the second capacitor is coupled to the second node, and the second terminal of the second capacitor is coupled to the second terminal of the first capacitor.

In an embodiment of this disclosure, the first driving circuit comprises a first driving transistor, a gate of the first driving transistor being coupled to the first node, a first terminal of the first driving transistor being coupled to the second voltage signal terminal, and a second terminal of the first driving transistor being coupled to the light emitting circuit.

In an embodiment of this disclosure, the second driving circuit comprises a second driving transistor, a gate of the second driving transistor being coupled to the second node, a first terminal of the second driving transistor being coupled to the second voltage signal terminal, and a second terminal of the second driving transistor being coupled to the light emitting circuit.

In an embodiment of this disclosure, the transistors in the driving control circuit are all N-type transistors.

In an embodiment of this disclosure, the transistors in the driving control circuit are all P-type transistors.

In an embodiment of this disclosure, the transistors in the first driving circuit and the second driving circuit are all N-type transistors or are all P-type transistors.

According to a second aspect of this disclosure, a pixel circuit is provided, comprising the pixel driving circuit as stated above and a light emitting circuit. The pixel driving circuit is connected with the light emitting circuit and is configured to drive the light emitting circuit to emit light.

In an embodiment of this disclosure, the light emitting circuit comprises an organic light emitting diode.

According to a third aspect, an array substrate is provided, comprising the pixel circuit as stated above.

According to a fourth aspect, a display device is provided, comprising the array substrate as stated above.

According to a fifth aspect of this disclosure, a driving method for driving the pixel circuit as stated above is provided. In the driving method, in a first phase, an effective voltage signal is inputted to the first scanning line, and an ineffective voltage signal is inputted to the second scanning line, so as to enable the driving control circuit to control one of the first driving circuit and the second driving circuit to be turned on. In a second phase, an ineffective voltage signal is inputted to the first scanning line and the second scanning line, and the driving control circuit keeps one of the first driving circuit and the second driving circuit being turned on, so as to drive the light emitting circuit to emit light. In a third phase, an effective voltage signal is inputted to the second scanning line, and an ineffective voltage signal is inputted to the first scanning line, so as to enable the driving control circuit to control the other of the first driving circuit and the second driving circuit to be turned on. In a fourth phase, an ineffective voltage signal is inputted to the first scanning line and the second scanning line, and the driving control circuit keeps the other of the first driving circuit and the second driving circuit being turned on, so as to drive the light emitting circuit to emit light.

In an embodiment of this disclosure, the transistors in the driving control circuit are all N-type transistors, the effective voltage signal is a high level signal, and the ineffective voltage signal is a low level signal.

In an embodiment of this disclosure, the transistors in the driving control circuit are all P-type transistors, the effective voltage signal is a low level signal, and the ineffective voltage signal is a high level signal.

BRIEF DESCRIPTION OF THE DRAWINGS

In order to explain the technical solutions of embodiments of this disclosure more clearly, the drawings of the embodiments will be explained briefly in the following. It should be aware that the drawings described below only relate to some embodiments of this disclosure rather than limitations to this disclosure, wherein.

DETAILED DESCRIPTION OF THE EMBODIMENTS

In order to enable the objects, the technical solutions and the advantages of embodiments of this disclosure to be clearer, next, the technical solutions of embodiments of this disclosure will be described clearly and completely in conjunction with the drawings. Apparently, the described embodiments are only part of, rather than all of the embodiments of this disclosure. Other embodiments obtained by the skilled person in the art based on the described embodiments of this disclosure on the premise of requiring no inventive efforts also belong to the protection scope of this disclosure.

Unless otherwise defined, all terms (including technical and scientific terms) used herein have the same meanings as generally understood by the skilled person in the art to which the subject matter of this disclosure belongs. It should be further understood that those terms as defined in generally used dictionaries should be interpreted as having consistent meanings as their meanings in the context of the description and the related technologies, and would not be interpreted in an ideal or too formal manner, unless otherwise explicitly defined herein. As used herein, the statement of "connecting" or "coupling" two or more parts together should means that the parts are directly combined together or combined through one or more intermediate components.

In all embodiments of this disclosure, the controlled intermediate terminal of a transistor is called the control terminal, the signal input terminal is called the first terminal, and the signal output terminal is called the second terminal consistently. The reason for this is that the source and the drain (the emitting terminal and the collecting terminal) of a transistor are symmetrical, and the direction of the drive current between the source and the drain (the emitting terminal and the collecting terminal) of the N-type transistor is opposite to that of the P-type transistor. The transistors used in the embodiments of this disclosure are mainly switch transistors and driving transistors. In addition, the capacitor used in the embodiments of this disclosure can also be replaced by an energy storage element with a similar function.

Figure 1:
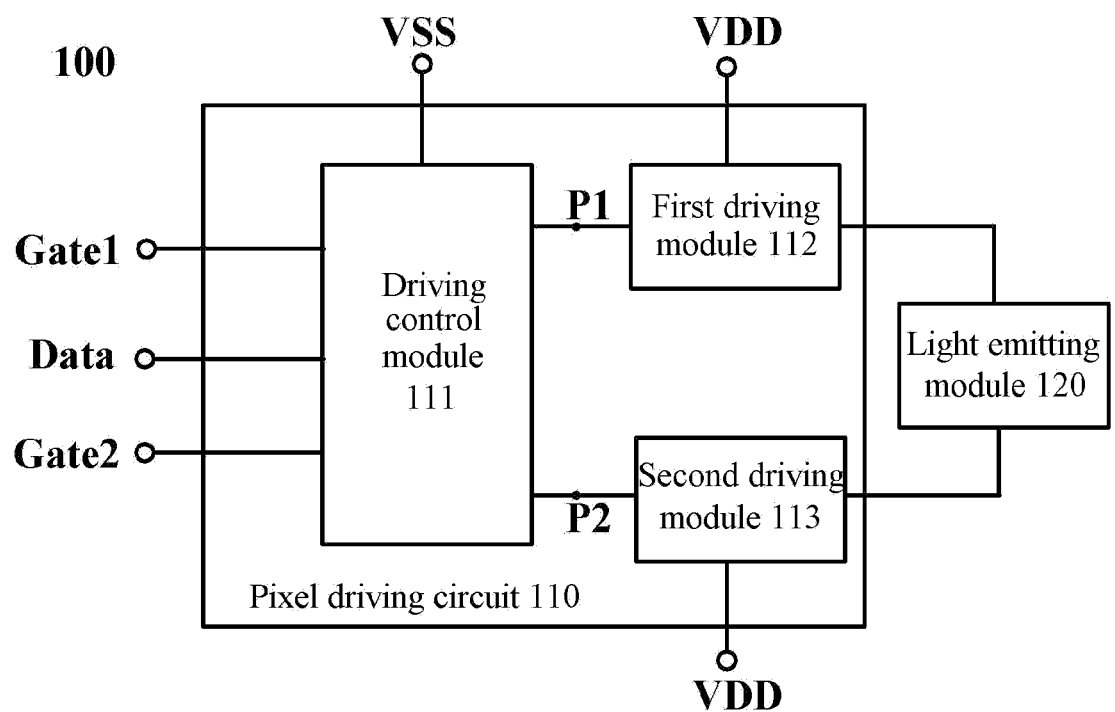
FIG. 1 is a schematic block diagram of a pixel circuit according to an embodiment of this disclosure.

FIG. 1 shows a schematic block diagram of a pixel circuit 100 according to an embodiment of this disclosure. As shown in FIG. 1, the pixel circuit 100 can comprise a pixel driving circuit 110 and a light emitting circuit 120. The pixel driving circuit 110 can comprise a driving control circuit 111, a first driving circuit 112 and a second driving circuit 113. The driving control circuit 111 can be connected to a data line Data, a first scanning line Gate1, a second scanning line Gate2, and a first voltage signal terminal VSS. Besides, The driving control circuit 111 is connected to the first driving circuit 112 via a first node P1, and is connected to the second driving circuit 113 via a second node P2. The driving control circuit 111 can control the first driving circuit 112 to be turned on under the condition the first scanning line Gate1 outputs an effective voltage signal, and control the second driving circuit 113 to be turned on under the condition the second scanning line Gate2 outputs an effective voltage signal.

In an alternative embodiment of this embodiment, the driving control circuit 111 can control the second driving circuit 113 to be turned on under the condition the first scanning line Gate1 outputs an effective voltage signal, and control the first driving circuit 112 to be turned on under the condition the second scanning line Gate2 outputs an effective voltage signal.

In the embodiments of this disclosure, the effective voltage refers to a voltage that enables the transistor to be turned on. With the effective voltage, the transistor works, and can output the voltage of the first terminal of the transistor to its second terminal. Correspondingly, the ineffective voltage refers to a voltage that enables the transistor to be cut off. With the ineffective voltage, the transistor does not work and cannot output the voltage of the first terminal of the transistor to its second terminal.

In this embodiment and its alternative embodiment, the first scanning line Gate1 and the second scanning line Gate2 output an effective voltage signal alternately, so as to enable the driving transistors in the first driving circuit 112 and the second driving circuit 113 to be turned on or cut off alternately. In this way, the first driving circuit 112 and the second driving circuit 113 are enabled to drive the light emitting circuit 120 to emit light alternately. In other words, under the condition the first driving circuit 112 drives the light emitting circuit 120 to emit light, the second driving circuit 113 is in a recovery state, and under the condition the second driving circuit 113 drives the light emitting circuit 120 to emit light, the first driving circuit 112 is in the recovery state. The driving transistors in the first driving circuit 112 and the second driving circuit 113 all can enter the recovery state after working for a period of time. Thus, variations of the threshold voltage Vth and the mobility of the driving transistors in the first driving circuit 112 and the second driving circuit 113 over time can be reduced, so as to maintain the initial characteristics of the driving transistors, thereby prolonging the service life of the display panel.

Figure 2:
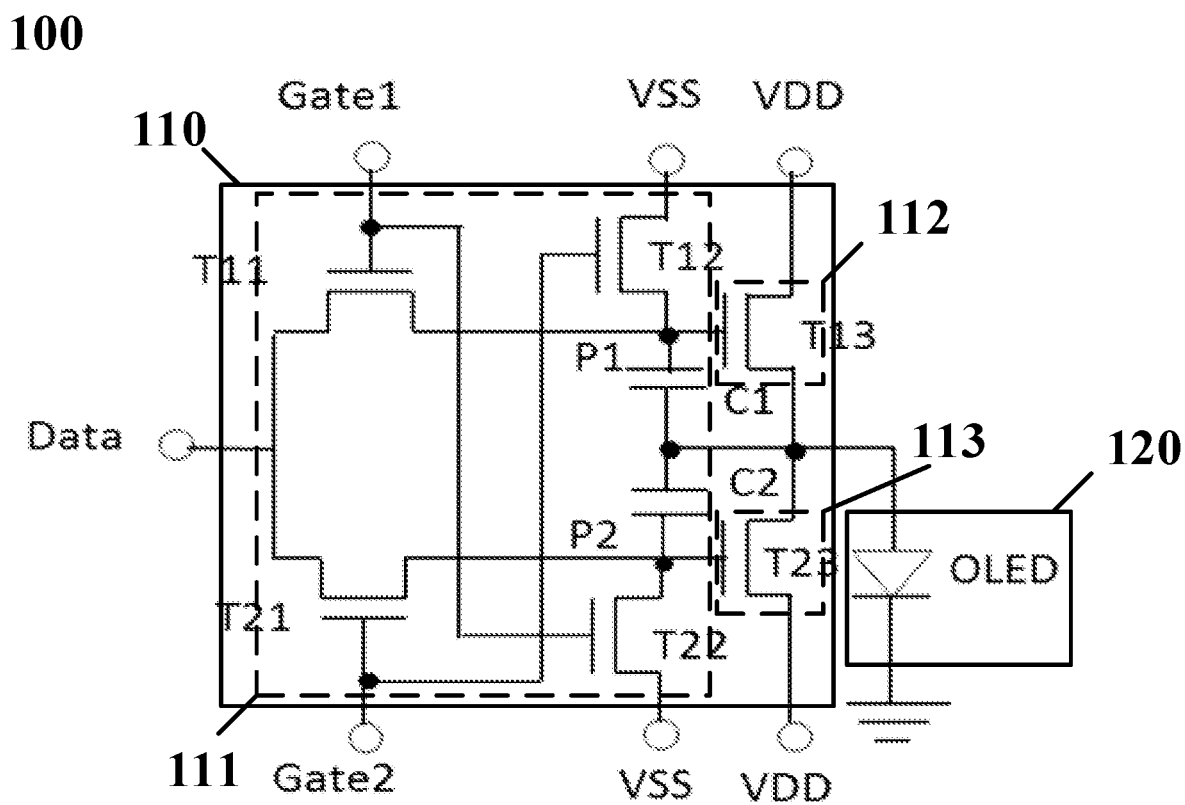
FIG. 2 is an exemplary circuit diagram of a pixel circuit according to an embodiment of this disclosure.

FIG. 2 shows an exemplary circuit diagram of the pixel circuit 100 according to an embodiment of this disclosure. As shown in FIG. 2, the driving control circuit 111 can comprise a first transistor T11, a second transistor T21, a third transistor T12, a fourth transistor T22, a first capacitor C1 and a second capacitor C2. A control terminal of the first transistor T11 is coupled to the first scanning line Gate1, a first terminal of the first transistor T11 is coupled to the data line Data, and a second terminal of the first transistor T11 is coupled to the first node P1. A control terminal of the second transistor T21 is coupled to the second scanning line Gate2, a first terminal of the second transistor T21 is coupled to the data line Data, and a second terminal of the second transistor T21 is coupled to the second node P2. A control terminal of the third transistor T12 is coupled to the second scanning line Gate2, a first terminal of the third transistor T12 is coupled to the first voltage signal terminal VSS, and a second terminal of the third transistor T12 is coupled to the first node P1. A control terminal of the fourth transistor T22 is coupled to the first scanning line Gate1, a first terminal of the fourth transistor T22 is coupled to the first voltage signal terminal VSS, and a second terminal of the fourth transistor T22 is coupled to the second node P2. A first terminal of the first capacitor C1 is coupled to the first node P1, and a second terminal of the first capacitor C1 is coupled to a second terminal of the second capacitor C2. A first terminal of the second capacitor C2 is coupled to the second node P2, and the second terminal of the second capacitor C2 is coupled to the second terminal of the first capacitor C1.

The first driving circuit 112 can comprise a first driving transistor T13, a gate of the first driving transistor T13 being coupled to the first node P1, a first terminal of the first driving transistor T13 being coupled to a second voltage signal terminal VDD, and a second terminal of the first driving transistor T13 being coupled to the light emitting circuit 120.

The second driving circuit 113 comprises a second driving transistor T23, a gate of the second driving transistor T23 being coupled to the second node P2, a first terminal of the second driving transistor T23 being coupled to the second voltage signal terminal VDD, and a second terminal of the second driving transistor T23 being coupled to the light emitting circuit 120.

The light emitting circuit 120 can comprise an organic light emitting diode.

As shown in FIG. 2, in one example, the second terminal of the first capacitor C1, the second terminal of the second capacitor C2, the second terminal of the first driving transistor T13 and the second terminal of the second driving transistor T23 are jointly coupled to the anode of the organic light emitting diode. The cathode of the organic light emitting diode is connected to the ground.

Figure 3:
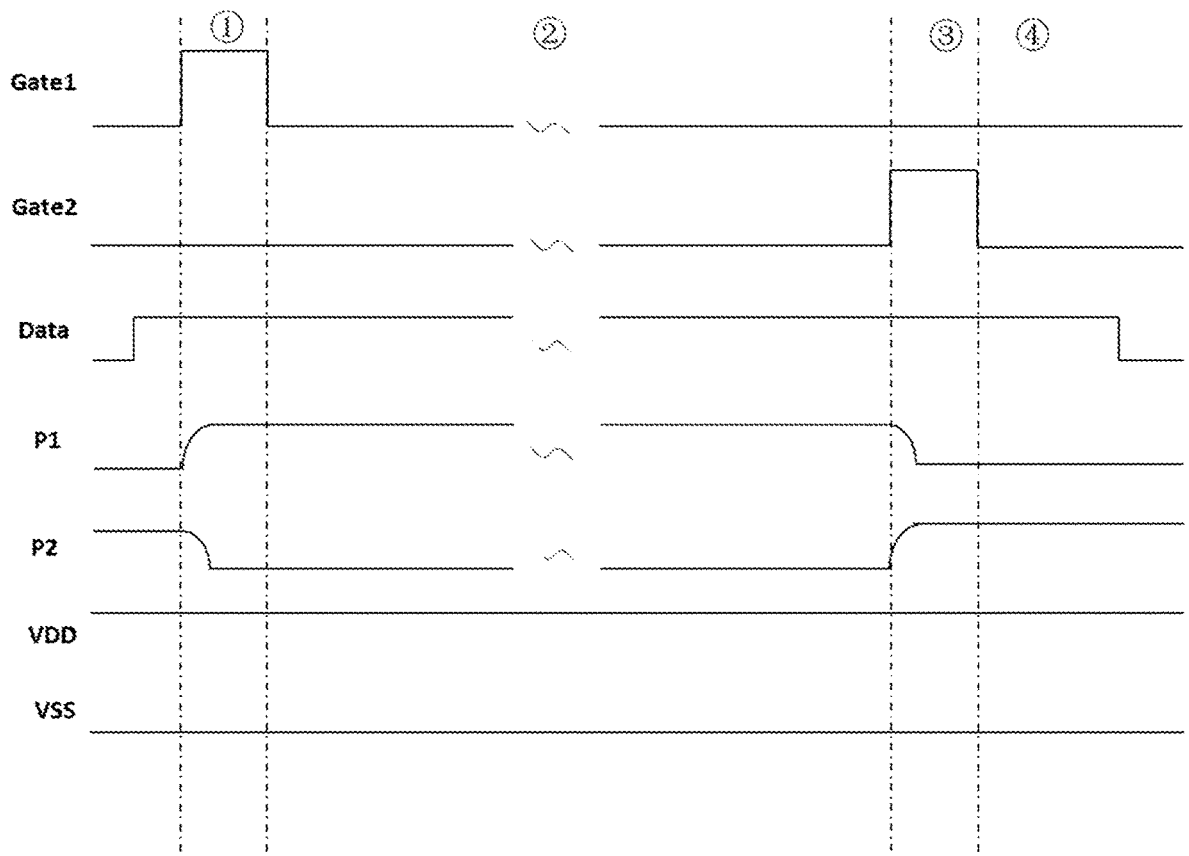
FIG. 3 is a timing diagram of signals in the pixel circuit as shown in FIG. 2.

FIG. 3 shows a timing diagram of signals in the pixel circuit 100 as shown in FIG. 2. Next, the working process of the pixel circuit 100 as shown in FIG. 2 will be described in detail in conjunction with the timing diagram as shown in FIG. 3. In the following description, assume that all the transistors are N-type transistors, the first voltage signal terminal VSS outputs a low level signal, and the second voltage signal terminal VDD outputs a high level signal.

Figure 4:
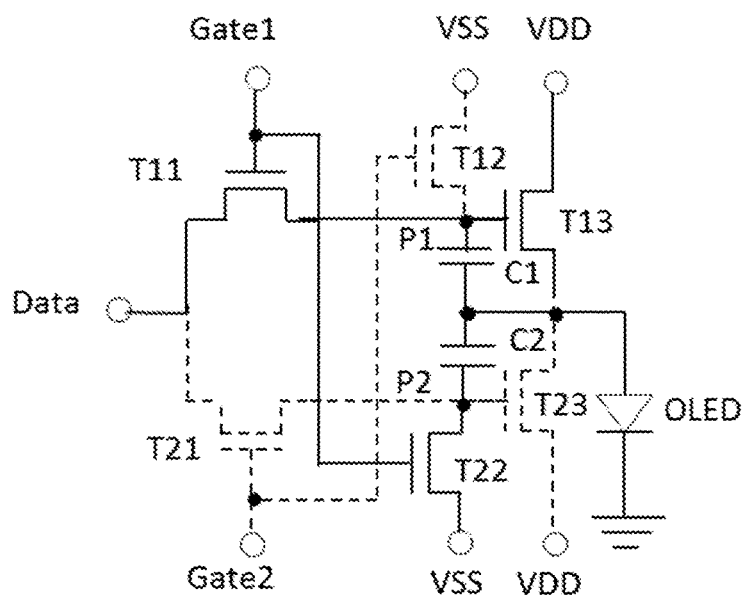
FIG. 4 is an equivalent working circuit diagram of the pixel circuit as shown in FIG. 2 in a first phase.

In a first phase (the equivalent working circuit of the pixel circuit 100 is as shown in FIG. 4), Gate1=1, Gate2=0, Data=1, VDD=1, and VSS=0.

A high level signal is inputted to the first scanning line Gate1, so as to enable the first transistor T11 and the fourth transistor T22 to be turned on. A low level signal is inputted to the second scanning line Gate2, so as to enable the second transistor T21 and the third transistor T12 to be cut off.

Because the first transistor T11 is turned on, the data signal (high level) inputted from the data line Data is outputted to the first node P1 through the first transistor T11. Meanwhile, because the third transistor T12 is cut off, the low level signal outputted from the first voltage signal terminal VSS would not influence the voltage of the first node P1. Hence, the data signal inputted from the data line Data enables the voltage of the first node P1 to rise up. When the voltage of the first node P1 rises to the threshold voltage Vth of the first driving transistor T13, the first driving transistor T13 is turned on. The high level signal from the second voltage signal terminal VDD is outputted to the anode of the organic light emitting diode through the first driving transistor T13, so as to drive the organic light emitting diode to emit light.

However, because the second transistor T21 is cut off, the data signal (high level) inputted from the data line Data cannot be outputted to the second node P2 through the second transistor T21. Meanwhile, because the fourth transistor T22 is turned on, the low level signal outputted from the first voltage signal terminal VSS enables the voltage of the second node P2 to drop to a low level. Hence, the second driving transistor T23 is cut off and is in a recovery state.

Figure 5:
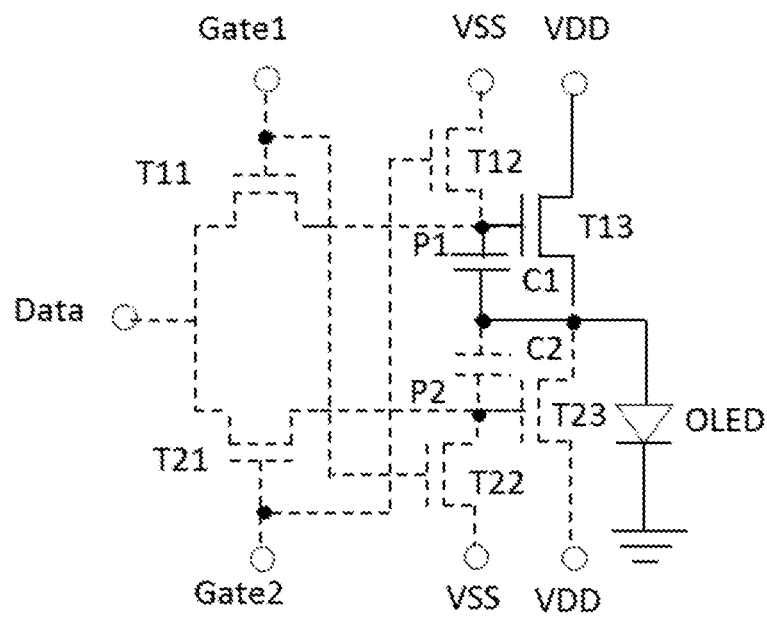
FIG. 5 is an equivalent working circuit diagram of the pixel circuit as shown in FIG. 2 in a second phase.

In a second phase (the equivalent working circuit of the pixel circuit 100 is as shown in FIG. 5), Gate1=0, Gate2=0, Data=1, VDD=1, and VSS=0.

A low level signal is inputted to the first scanning line Gate1 and the second scanning line Gate2, the first to the fourth transistors (T11, T21, T12, and T22) are all cut off. The voltage of the first node P1 is kept at a high level by the first capacitor C1, so as to keep the first driving transistor T13 being turned on. The high level signal from the second voltage signal terminal VDD is outputted to the anode of the organic light emitting diode through the first driving transistor T13, so as to keep driving the organic light emitting diode to emit light. However, the voltage of the second node P2 is kept at a low level by the second capacitor C2. Hence, the second driving transistor T23 is cut off and is in a recovery state.

That is to say, in the first and second phases, the driving current for the organic light emitting diode is only controlled by the first driving transistor T13.

Figure 6:
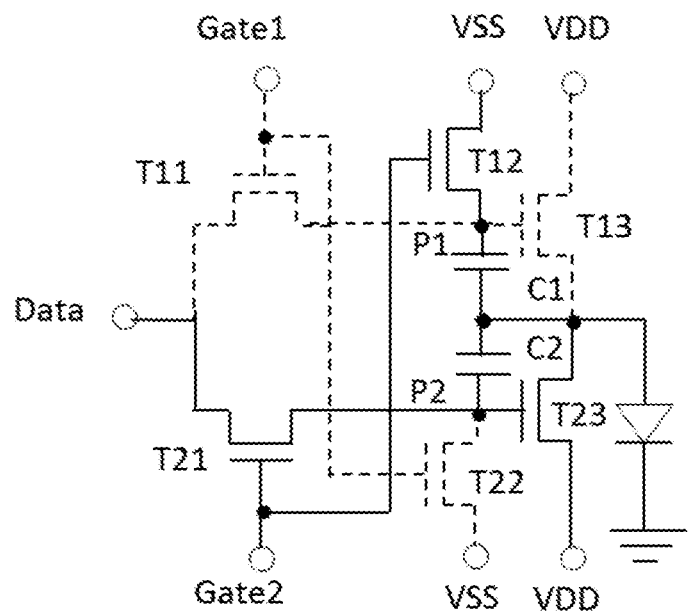
FIG. 6 is an equivalent working circuit diagram of the pixel circuit as shown in FIG. 2 in a third phase.

In a third phase (the equivalent working circuit of the pixel circuit 100 is as shown in FIG. 6), Gate1=0, gate2=1, Data=1, VDD=1, and VSS=0.

A low level signal is inputted to the first scanning line Gate1, so as to enable the first transistor T11 and the fourth transistor T22 to be cut off. A high level signal is inputted to the second scanning line Gate2, so as to enable the second transistor T21 and the third transistor T12 to be turned on.

Because the second transistor T21 is turned on, the data signal (high level) inputted from the data line Data is outputted to the second node P2 through the second transistor T21. Meanwhile, because the fourth transistor T22 is cut off, the low level signal outputted from the first voltage signal terminal VSS would not influence the voltage of the second node P2. Hence, the data signal inputted from the data line Data enables the voltage of the second node P2 to rise up. When the voltage of the second node P2 rises to the threshold voltage Vth of the second driving transistor T23, the second driving transistor T23 is turned on. The high level signal from the second voltage signal terminal VDD is outputted to the anode of the organic light emitting diode through the second driving transistor T23, so as to drive the organic light emitting diode to emit light.

However, because the first transistor T11 is cut off, the data signal (high level) inputted from the data line Data cannot be outputted to the first node P1 through the first transistor T11. Meanwhile, because the third transistor T12 is turned on, the low level signal outputted from the first voltage signal terminal VSS enables the voltage of the first node P1 to drop to a low level. Hence, the first driving transistor T13 is cut off and is in a recovery state.

Figure 7:
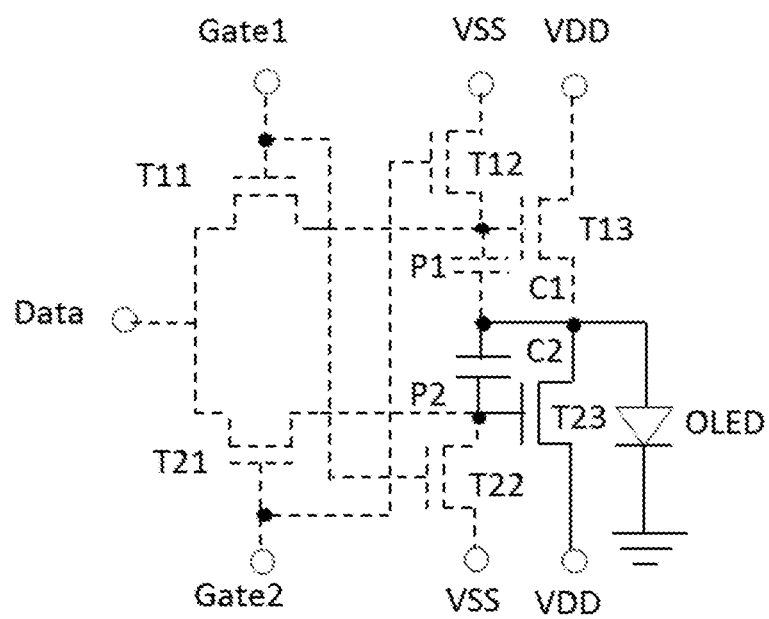
FIG. 7 is an equivalent working circuit diagram of the pixel circuit as shown in FIG. 2 in a fourth phase.

In a fourth phase (the equivalent working circuit of the pixel circuit 100 is as shown in FIG. 7), Gate1=0, gate2=0, Data=1, VDD=1, and VSS=0.

A low level signal is inputted to the first scanning line Gate1 and the second scanning line Gate2, and the first to the fourth transistors (T11, T21, T12, and T22) are all cut off. The voltage of the second node P2 is kept at a high level by the second capacitor C2, so as to keep the second driving transistor T23 being turned on. The high level signal from the second voltage signal terminal VDD is outputted to the anode of the organic light emitting diode through the second driving transistor T23, so as to keep driving the organic light emitting diode to emit light. While, the voltage of the first node P1 is kept at a low level by the first capacitor C1. Hence, the first driving transistor T13 is cut off and is in a recovery state.

That is to say, in the third and fourth phases, the driving current of the organic light emitting diode is only controlled by the second driving transistor T23.

Afterwards, the pixel circuit 100 repeats the working states in the above four phases.

In order to keep the light emitting brightness of the organic light emitting diode under a same data voltage in each phase to be the same, the first capacitor C1 and the second capacitor C2 with completely same structure parameters, and the first driving transistor T13 and the second driving transistor T23 with completely same structure parameters can be chosen in design of the circuit structure. That is to say, the capacitance values of the first capacitor C1 and the second capacitor C2 are the same (thereby enabling their charging and discharging times to be also the same), and the channel parameters (width and length) of the first driving transistor T13 and the second driving transistor T23 are the same.

In addition, the skilled person in the art should be aware that in an alternative embodiment of this embodiment, the transistors in the pixel circuit 100 as shown in FIG. 2 can also be all P-type transistors. Next, the working process of the pixel circuit 100 in such a case will be described in detail, wherein the first voltage signal terminal VSS outputs a low level signal, and the second voltage signal terminal VDD outputs a high level signal.

In the first phase, Gate1=0, Gate2=1, Data=1, VDD=1, and VSS=0.

A low level signal is inputted to the first scanning line Gate1, so as to enable the first transistor T11 and the fourth transistor T22 to be turned on. A high level signal is inputted to the second scanning line Gate2, so as to enable the second transistor T21 and the third transistor T12 to be cut off.

Because the second transistor T21 is cut off, the data signal (high level) inputted from the data line Data cannot be outputted to the second node P2 through the second transistor T21. Meanwhile, because the fourth transistor T22 is turned on, the low level signal outputted from the first voltage signal terminal VSS enables the voltage of the second node P2 to drop. When the voltage of the second node P2 drops to the threshold voltage Vth of the second driving transistor T23, the second driving transistor T23 is turned on. The high level signal from the second voltage signal terminal VDD is outputted to the anode of the organic light emitting diode through the second driving transistor T23, so as to drive the organic light emitting diode to emit light.

However, because the first transistor T11 is turned on, the data signal (high level) inputted from the data line Data is outputted to the first node P1 through the first transistor T11. Meanwhile, because the third transistor T12 is cut off, the low level signal outputted from the first voltage signal terminal VSS would not influence the voltage of the first node P1. Hence, the data signal inputted from the data line Data enables the voltage of the first node P1 to rise up to a high level, thereby enabling the first driving transistor T13 to be cut off and in a recovery state.

In the second phase, Gate1=1, Gate2=1, Data=1, VDD=1, and VSS=0.

A high level signal is inputted to the first scanning line Gate1 and the second scanning line Gate2, and the first to the fourth transistors (T11, T21, T12, and T22) are all cut off. The voltage of the second node P2 is kept at a low level by the second capacitor C2, so as to keep the second driving transistor T23 being turned on. The high level signal from the second voltage signal terminal VDD is outputted to the anode of the organic light emitting diode through the second driving transistor T23, so as to keep driving the organic light emitting diode to emit light. While, the voltage of the first node P1 is kept at a high level by the first capacitor C1. Hence, the first driving transistor T13 is cut off and is in a recovery state.

That is to say, in the first and second phases, the driving current for the organic light emitting diode is only controlled by the second driving transistor T23.

In the third phase, Gate1=1, Gate2=0, Data=1, VDD=1, and VSS=0.

A high level signal is inputted to the first scanning line Gate1, so as to enable the first transistor T11 and the fourth transistor T22 to be cut off A low level signal is inputted to the second scanning line Gate2, so as to enable the second transistor T21 and the third transistor T12 to be turned on.

Because the first transistor T11 is cut off, the data signal (high level) inputted from the data line Data cannot be outputted to the first node P1 through the first transistor T11. Meanwhile, because the third transistor T12 is turned on, the low level signal outputted from the first voltage signal terminal VSS enables the voltage of the first node P1 to drop. When the voltage of the first node P1 drops to the threshold voltage Vth of the first driving transistor T13, the first driving transistor T13 is turned on. The high level signal from the second voltage signal terminal VDD is outputted to the anode of the organic light emitting diode through the first driving transistor T13, so as to drive the organic light emitting diode to emit light.

However, because the second transistor T21 is turned on, the data signal (high level) inputted from the data line Data is outputted to the second node P2 through the second transistor T21. Meanwhile, because the fourth transistor T22 is cut off, the low level signal outputted from the first voltage signal terminal VSS would not influence the voltage of the second node P2. Hence, the data signal inputted from the data line Data enables the voltage of the second node P2 to rise up to a high level, thereby enabling the second driving transistor T23 to be cut off and in a recovery state.

In the fourth phase, Gate1=1, Gate2=1, Data=1, VDD=1, and VSS=0. A high level signal is inputted to the first scanning line Gate1 and the second scanning line Gate2, and the first to the fourth transistors (T11, T21, T12, and T22) are all cut off. The voltage of the first node P1 is kept at a low level by the first capacitor C1, so as to keep the first driving transistor T13 being turned on. The high level signal from the second voltage signal terminal VDD is outputted to the anode of the organic light emitting diode through the first driving transistor T13, so as to keep driving the organic light emitting diode to emit light. While, the voltage of the second node P2 is kept at a high level by the second capacitor C2. Hence, the second driving transistor T23 is cut off and is in a recovery state.

That is to say, in the third and fourth phases, the driving current for the organic light emitting diode is only controlled by the first driving transistor T13.

Afterwards, the pixel circuit 100 repeats the working states in the above four phases.

In another alternative embodiment of this embodiment, in the pixel circuit 100 as shown in FIG. 2, the transistors in the driving control circuit 111 are all N-type transistors, while the driving transistors in the first driving circuit 112 and the second driving circuit 113 are all P-type transistors. Next, the working process of the pixel circuit 100 in such a case will be described in detail in conjunction with the timing diagram as shown in FIG. 3, wherein the first voltage signal terminal VSS outputs a low level signal, and the second voltage signal terminal VDD outputs a high level signal.

In the first phase, Gate1=1, Gate2=0, Data=1, VDD=1, and VSS=0.

A high level signal is inputted to the first scanning line Gate1, so as to enable the first transistor T11 and the fourth transistor T22 to be turned on. A low level signal is inputted to the second scanning line Gate2, so as to enable the second transistor T21 and the third transistor T12 to be cut off.

Because the second transistor T21 is cut off, the data signal (high level) inputted from the data line Data cannot be outputted to the second node P2 through the second transistor T21. Meanwhile, because the fourth transistor T22 is turned on, the low level signal outputted from the first voltage signal terminal VSS enables the voltage of the second node P2 to drop. When the voltage of the second node P2 drops to the threshold voltage Vth of the second driving transistor T23, the second driving transistor T23 is turned on. The high level signal from the second voltage signal terminal VDD is outputted to the anode of the organic light emitting diode through the second driving transistor T23, so as to drive the organic light emitting diode to emit light.

However, because the first transistor T11 is turned on, the data signal (high level) inputted from the data line Data is outputted to the first node P1 through the first transistor T11. Meanwhile, because the third transistor T12 is cut off, the low level signal outputted from the first voltage signal terminal VSS would not influence the voltage of the first node P1. Hence, the data signal inputted from the data line Data enables the voltage of the first node P1 to rise up to a high level, thereby enabling the first driving transistor T13 to be cut off and in a recovery state.

In the second phase, Gate1=0, Gate2=0, Data=1, VDD=1, and VSS=0.

A low level signal is inputted to the first scanning line Gate1 and the second scanning line Gate2, and the first to the fourth transistors (T11, T21, T12, and T22) are all cut off. The voltage of the second node P2 is kept at a low level by the second capacitor C2, so as to keep the second driving transistor T23 being turned on. The high level signal from the second voltage signal terminal VDD is outputted to the anode of the organic light emitting diode through the second driving transistor T23, so as to keep driving the organic light emitting diode to emit light. While, the voltage of the first node P1 is kept at a high level by the first capacitor C1. Hence, the first driving transistor T13 is cut off and is in a recovery state.

That is to say, in the first and second phases, the driving current for the organic light emitting diode is only controlled by the second driving transistor T23.

In the third phase, Gate1=0, Gate2=1, Data=1, VDD=1, and VSS=0.

A low level signal is inputted to the first scanning line Gate1, so as to enable the first transistor T11 and the fourth transistor T22 to be cut off. A high level signal is inputted to the second scanning line Gate2, so as to enable the second transistor T21 and the third transistor T12 to be turned on.

Because the first transistor T11 is cut off, the data signal (high level) inputted from the data line Data cannot be outputted to the first node P1 through the first transistor T11. Meanwhile, because the third transistor T12 is turned on, the low level signal outputted from the first voltage signal terminal VSS enables the voltage of the first node P1 to drop. When the voltage of the first node P1 drops to the threshold voltage Vth of the first driving transistor T13, the first driving transistor T13 is turned on. The high level signal from the second voltage signal terminal VDD is outputted to the anode of the organic light emitting diode through the first driving transistor T13, so as to drive the organic light emitting diode to emit light.

However, because the second transistor T21 is turned on, the data signal (high level) inputted from the data line Data is outputted to the second node P2 through the second transistor T21. Meanwhile, because the fourth transistor T22 is cut off, the low level signal outputted from the first voltage signal terminal VSS would not influence the voltage of the second node P2. Hence, the data signal inputted from the data line Data enables the voltage of the second node P2 to rise up to a high level, thereby enabling the second driving transistor T23 to be cut off and in a recovery state.

In the fourth phase, Gate1=0, Gate2=0, Data=1, VDD=1, and VSS=0.

A low level signal is inputted to the first scanning line Gate1 and the second scanning line Gate2, and the first to the fourth transistors (T11, T21, T12, and T22) are all cut off. The voltage of the first node P1 is kept at a low level by the first capacitor C1, so as to keep the first driving transistor T13 being turned on. The high level signal from the second voltage signal terminal VDD is outputted to the anode of the organic light emitting diode through the first driving transistor T13, so as to keep driving the organic light emitting diode to emit light. While, the voltage of the second node P2 is kept at a high level by the second capacitor C2. Hence, the second driving transistor T23 is cut off and is in a recovery state.

That is to say, in the third and fourth phases, the driving current for the organic light emitting diode is only controlled by the first driving transistor T13.

Afterwards, the pixel circuit 100 repeats the working states in the above four phases.

In a further alternative embodiment of this embodiment, in the pixel circuit 100 as shown in FIG. 2, the transistors in the driving control circuit 111 are all P-type transistors, while the driving transistors in the first driving circuit 112 and the second driving circuit 113 are all N-type transistors. Next, the working process of the pixel circuit 100 in such a case will be described in detail, wherein the first voltage signal terminal VSS outputs a low level signal, and the second voltage signal terminal VDD outputs a high level signal.

In the first phase, Gate1=0, Gate2=1, Data=1, VDD=1, and VSS=0.

A low level signal is inputted to the first scanning line Gate1, so as to enable the first transistor T11 and the fourth transistor T22 to be turned on. A high level signal is inputted to the second scanning line Gate2, so as to enable the second transistor T21 and the third transistor T12 to be cut off.

Because the first transistor T11 is turned on, the data signal (high level) inputted from the data line Data is outputted to the first node P1 through the first transistor T11. Meanwhile, because the third transistor T12 is cut off, the low level signal outputted from the first voltage signal terminal VSS would not influence the voltage of the first node P1. Hence, the data signal inputted from the data line Data enables the voltage of the first node P1 to rise up. When the voltage of the first node P1 rises to the threshold voltage Vth of the first driving transistor T13, the first driving transistor T13 is turned on. The high level signal from the second voltage signal terminal VDD is outputted to the anode of the organic light emitting diode through the first driving transistor T13, so as to drive the organic light emitting diode to emit light.

However, because the second transistor T21 is cut off, the data signal (high level) inputted from the data line Data cannot be outputted to the second node P2 through the second transistor T21. Meanwhile, because the fourth transistor T22 is turned on, the low level signal outputted from the first voltage signal terminal VSS enables the voltage of the second node P2 to drop to a low level. Hence, the second driving transistor T23 is cut off and is in a recovery state.

In the second phase, Gate1=1, Gate2=1, Data=1, VDD=1, and VSS=0.

A high level signal is inputted to the first scanning line Gate1 and the second scanning line Gate2, and the first to the fourth transistors (T11, T21, T12, and T22) are all cut off. The voltage of the first node P1 is kept at a high level by the first capacitor C1, so as to keep the first driving transistor T13 being turned on. The high level signal from the second voltage signal terminal VDD is outputted to the anode of the organic light emitting diode through the first driving transistor T13, so as to keep driving the organic light emitting diode to emit light. While, the voltage of the second node P2 is kept at a low level by the second capacitor C2. Hence, the second driving transistor T23 is cut off and is in a recovery state.

That is to say, in the first and second phases, the driving current for the organic light emitting diode is only controlled by the first driving transistor T13.

In the third phase, Gate1=1, Gate2=0, Data=1, VDD=1, and VSS=0.

A high level signal is inputted to the first scanning line Gate1, so as to enable the first transistor T11 and the fourth transistor T22 to be cut off. A low level signal is inputted to the second scanning line Gate2, so as to enable the first transistor T21 and the third transistor T12 to be turned on.

Because the second transistor T21 is turned on, the data signal (high level) inputted from the data line Data is outputted to the second node P2 through the second transistor T21. Meanwhile, because the fourth transistor T22 is cut off, the low level signal outputted from the first voltage signal terminal VSS would not influence the voltage of the second node P2. Hence, the data signal inputted from the data line Data enables the second node P2 to rise up. When the voltage of the second node P2 rises to the threshold voltage Vth of the second driving transistor T23, the second driving transistor T23 is turned on. The high level signal from the second voltage signal terminal VDD is outputted to the anode of the organic light emitting diode through the second driving transistor T23, so as to drive the organic light emitting diode to emit light.

However, because the first transistor T11 is cut off, the data signal (high level) inputted from the data line Data cannot be outputted to the first node P1 through the first transistor T11. Meanwhile, because the third transistor T12 is turned on, the low level signal outputted from the first voltage signal terminal VSS enables the voltage of the first node P1 to drop to a low level. Hence, the first driving transistor T13 is cut off and is in a recovery state.

In the fourth phase, Gate1=1, Gate2=1, Data=1, VDD=1, and VSS=0.

A high level signal is inputted to the first scanning line Gate1 and the second scanning line Gate2, and the first to the fourth transistors (T11, T21, T12, and T22) are all cut off. The voltage of the second node P2 is kept at a high level by the second capacitor C2, so as to keep the second driving transistor 23 being turned on. The high level signal from the second voltage signal terminal VDD is outputted to the anode of the organic light emitting diode through the second driving transistor T23, so as to keep driving the organic light emitting diode to emit light. While, the voltage of the first node P1 is kept at a low level by the first capacitor C1. Hence, the first driving transistor T13 is cut off and is in a recovery state.

That is to say, in the third and fourth phases, the driving current for the organic light emitting diode is only controlled by the second driving transistor T23.

Afterwards, the pixel circuit 100 repeats the working states in the above four phases.

Figure 8:
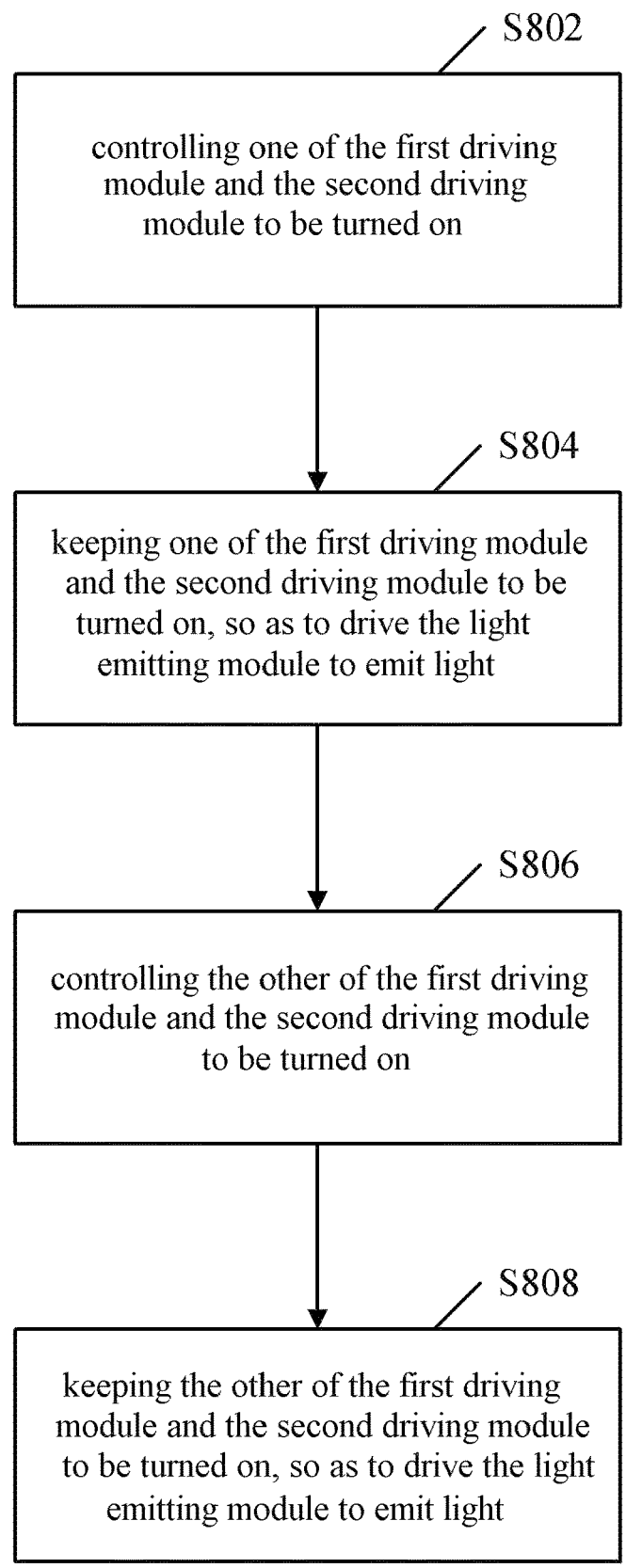
FIG. 8 is a schematic flow chart of a driving method for driving the pixel circuit as shown in FIG. 1 according to an embodiment of this disclosure.

FIG. 8 is a schematic flow chart of a driving method for driving the pixel circuit 100 as shown in FIG. 1 according to an embodiment of this disclosure.

At step S802, in the first phase, an effective voltage signal is inputted to the first scanning line, and an ineffective voltage signal is inputted to the second scanning line, enabling the driving control circuit to control one of the first driving circuit and the second driving mode to be turned on.

Subsequently, at step S804, in the second phase, an ineffective voltage signal is inputted to the first scanning line and the second scanning line, and one of the first driving circuit and the second driving circuit is kept being turned on, so as to drive the light emitting circuit to emit light.

Afterwards, at step S806, in the third phase, an effective voltage signal is inputted to the second scanning line, and an ineffective voltage signal is inputted to the first scanning line, enabling the driving control circuit to control the other of the first driving circuit and the second driving circuit to be turned on.

Finally, at step S808, in the fourth phase, an ineffective voltage signal is inputted to the first scanning line and the second scanning line, and the other of the first driving circuit and the second driving circuit is kept being turned on, so as to drive the light emitting circuit to emit light.

In one example of this embodiment, the transistors in the driving control circuit are all N-type transistors, while the transistors in the first driving circuit and the second driving circuit are all N-type transistors. Moreover, the effective voltage signal is a high level signal, and the ineffective voltage signal is a low level signal. The pixel driving method can be further elaborated as follows.

At step S802, in the first phase, a high level signal is inputted to the first scanning line, and a low level signal is inputted to the second scanning line, enabling the driving control circuit to control only the first driving circuit to be turned on.

Subsequently, at step S804, in the second phase, a low level signal is inputted to the first scanning line and the second scanning line, and only the first driving circuit is kept being turned on, so as to drive the light emitting circuit to emit light.

Afterwards, at step S806, in the third phase, a low level signal is inputted to the first scanning line, and a high level signal is inputted to the second scanning line, enabling the driving control circuit to control only the second driving circuit to be turned on.

Finally, at step S808, in the fourth phase, a low level signal is inputted to the first scanning line and the second scanning line, and only the second driving circuit is kept being turned on, so as to drive the light emitting circuit to emit light.

In one example of this embodiment, the transistors in the driving control circuit are all P-type transistors, while the transistors in the first driving circuit and the second driving circuit are all P-type transistor. Moreover, the effective voltage signal is a low level signal, and the ineffective voltage signal is a high level signal. The pixel driving method can be further elaborated as follows.

At step S802, in the first phase, a low level signal is inputted to the first scanning line, and a high level signal is inputted to the second scanning line, enabling the driving control circuit to control only the second driving circuit to be turned on.

Subsequently, at step S804, in the second phase, a high level signal is inputted to the first scanning line and the second scanning line, and only the second driving circuit is kept being turned on, so as to drive the light emitting circuit to emit light.

Afterwards, at step S806, in the third phase, a high level signal is inputted to the first scanning line, and a low level signal is inputted to the second scanning line, enabling the driving control circuit to control only the first driving circuit to be turned on.

Finally, at step S808, in the fourth phase, a high level signal is inputted to the first scanning line and the second scanning line, and only the first driving circuit is kept being turned on, so as to drive the light emitting circuit to emit light.

In one example of this embodiment, the transistors in the driving control circuit are all N-type transistors, while the transistors in the first driving circuit and the second driving circuit are all P-type transistors. Moreover, the effective voltage signal is a high level signal, and the ineffective voltage signal is a low level signal. The pixel driving method can be further elaborated as follows.

At step S802, in the first phase, a high level signal is inputted to the first scanning line, and a low level signal is inputted to the second scanning line, enabling the driving control circuit to control only the second driving circuit to be turned on.

Subsequently, at step S804, in the second phase, a low level signal is inputted to the first scanning line and the second scanning line, and only the second driving circuit is kept being turned on, so as to drive the light emitting circuit to emit light.

Afterwards, at step S806, in the third phase, a low level signal is inputted to the first scanning line, and a high level signal is inputted to the second scanning line, enabling the driving control circuit to control only the first driving circuit to be turned on.

Finally, at step S808, in the fourth phase, a low level signal is inputted to the first scanning line and the second scanning line, and only the first driving circuit is kept being turned on, so as to drive the light emitting circuit to emit light.

In one example of this embodiment, the transistors in the driving control circuit are all P-type transistors, while the transistors in the first driving circuit and the second driving circuit are all P-type transistor. Moreover, the effective voltage signal is a low level signal, and the ineffective voltage signal is a high level signal. The pixel driving method can be further elaborated as follows.

At step S802, in the first phase, a low level signal is inputted to the first scanning line, and a high level signal is inputted to the second scanning line, enabling the driving control circuit to control only the first driving circuit to be turned on.

Subsequently, at step S804, in the second phase, a high level signal is inputted to the first scanning line and the second scanning line, and only the first driving circuit is kept being turned on, so as to drive the light emitting circuit to emit light.

Afterwards, at step S806, in the third phase, a high level signal is inputted to the first scanning line, and a low level signal is inputted to the second scanning line, enabling the driving control circuit to control only the second driving circuit to be turned on.

Finally, at step S808, in the fourth phase, a high level signal is inputted to the first scanning line and the second scanning line, and only the second driving circuit is kept being turned on, so as to drive the light emitting circuit to emit light.

From the above description it can be seen that the pixel circuit and driving method thereof, the array substrate as well as the display panel according to embodiments of this disclosure output an effective voltage signal through the first scanning line Gate1 and the second scanning line Gate2 alternately. In this way, the driving transistors in the first driving circuit 112 and the second driving circuit 113 are enabled to be turned on or cut off alternately, causing the first driving circuit 112 and the second driving circuit 113 to drive the light emitting circuit 120 to emit light alternately. In other words, when the first driving circuit 112 drives the light emitting circuit 120 to emit light, the second driving circuit 113 is in a recovery state. Alternatively, when the second driving circuit 113 drives the light emitting circuit 120 to emit light, the first driving circuit 112 is in the recovery state. The driving transistors in the first driving circuit 112 and the second driving circuit 113 can all enter the recovery state after working for a period of time, thus variations of the threshold voltage Vth and the mobility of the driving transistors in the first driving circuit 112 and the second driving circuit 113 with the passage of time can be reduced. In this way, the initial characteristics of the driving transistors are maintained, thereby prolonging the service life of the display panel.

The display device provided by an embodiment of this disclosure can be applied in any product with a display function, e.g., electronic paper, mobile phone, panel computer, television, laptop, digital photoframe or navigator etc.

Unless otherwise explicitly pointed out in the context, a singular form used in this text and the claims attached includes plural, and vice versa. Hence, when a singular is mentioned, it generally includes a plurality of corresponding term. Similarly, the wordings of "comprise" and "include" would be interpreted as inclusive rather than exclusive. Also, the terms of "include" and "or" should be interpreted as inclusive, unless such interpretation is explicitly prohibited in this text. When the term of "example" is used in this text, particularly when it is located after a set of terms, the "example" is only exemplary and explanative, and should not be regarded as exclusive or extensive.

Adaptive further aspects and scopes become obvious from the description provided in this text. It should be understood that each aspect of the present application can be carried out separately or by combining with one or more other aspects. It should also be understood that the description and particular embodiments in this text are only for explanation rather than limiting the scope of the present invention.

Several embodiments of this disclosure have been described in detail above. However, apparently, the skilled person in the art can make various amendments and modifications to the embodiments of this disclosure without departing from the spirit and the scope of this disclosure. The protection scope of this disclosure is defined by the claims attached.

The invention claimed is:

1. A pixel driving circuit, comprising a driving control circuit, a first driving circuit and a second driving circuit, wherein
the driving control circuit is connected to a data line, a first scanning line, a second scanning line, a first voltage signal terminal, and is connected to the first driving circuit via a first node, is connected to the second driving circuit via a second node, and is configured to control one of the first driving circuit and the second driving circuit to be turned on under the condition the first scanning line outputs an effective voltage signal, and control the other of the first driving circuit and the second driving circuit to be turned on under the condition the second scanning line outputs an effective voltage signal;
the first driving circuit is connected to the driving control circuit, a second voltage signal terminal and a light emitting circuit, and is configured to drive the light emitting circuit to emit light under control of the driving control circuit;
the second driving circuit is connected to the driving control circuit, the second voltage signal terminal and the light emitting circuit, and is configured to drive the light emitting circuit to emit light under control of the driving control circuit; and
the driving control circuit comprises: a first transistor, a second transistor, a third transistor, a fourth transistor, a first capacitor and a second capacitor, wherein
a control terminal of the first transistor is coupled to the first scanning line, a first terminal of the first transistor is coupled to the data line, and a second terminal of the first transistor is coupled to the first node;
a control terminal of the second transistor is coupled to the second scanning line, a first terminal of the second transistor is coupled to the data line, and a second terminal of the second transistor is coupled to the second node;
a control terminal of the third transistor coupled to the second scanning line, a first terminal of the third transistor is coupled to the first voltage signal terminal, and a second terminal of the third transistor is coupled to the first node;
a control terminal of the fourth transistor is coupled to the first scanning line, a first terminal of the fourth transistor is coupled to the first voltage signal terminal, and a second terminal of the fourth transistor is coupled to the second node;
a first terminal of the first capacitor is coupled to the first node, and a second terminal of the first capacitor is coupled to a second terminal of the second capacitor; and
a first terminal of the second capacitor is coupled to the second node, and the second terminal of the second capacitor is coupled to the second terminal of the first capacitor.

2. The pixel driving circuit according to claim 1, wherein the first scanning line and the second scanning line output an effective voltage signal alternately.

3. The pixel driving circuit according to claim 1, wherein the first driving circuit comprises a first driving transistor, a gate of the first driving transistor being coupled to the first node, a first terminal of the first driving transistor being coupled to the second voltage signal terminal, and a second terminal of the first driving transistor being coupled to the light emitting circuit.

4. The pixel driving circuit according to claim 1, wherein the second driving circuit comprises a second driving transistor, a gate of the second driving transistor being coupled to the second node, a first terminal of the second driving transistor being coupled to the second voltage signal terminal, and a second terminal of the second driving transistor being coupled to the light emitting circuit.

5. A pixel circuit, comprising:
the pixel driving circuit as claimed in claim 1, and
a light emitting circuit, wherein
the pixel driving circuit is connected with the light emitting circuit, and is configured to drive the light emitting circuit to emit light.

6. The pixel circuit according to claim 5, wherein the light emitting circuit comprises an organic light emitting diode.

7. An array substrate, comprising the pixel circuit as claimed in claim 6.

8. A display device, comprising the array substrate as claimed in claim 7.

9. A driving method for driving the pixel circuit as claimed in claim 6, comprising:
in a first phase, inputting an effective voltage signal to the first scanning line, inputting an ineffective voltage signal to the second scanning line, so as to enable the driving control circuit to control one of the first driving circuit and the second driving circuit to be turned on;

in a second phase, inputting an ineffective voltage signal to the first scanning line and the second scanning line, and keeping by the driving control circuit one of the first driving circuit and the second driving circuit being turned on, so as to drive the light emitting circuit to emit light;

in a third phase, inputting an effective voltage signal to the second scanning line, inputting an ineffective voltage signal to the first scanning line, so as to enable the driving control circuit to control the other of the first driving circuit and the second driving circuit to be turned on; and in a fourth phase, inputting an ineffective voltage signal to the first scanning line and the second scanning line, and keeping by the driving control circuit the other of the first driving circuit and the second driving circuit being turned on, so as to drive the light emitting circuit to emit light.

10. An array substrate, comprising the pixel circuit as claimed in claim 5.

11. A display device, comprising the array substrate as claimed in claim 10.

12. A driving method for driving the pixel circuit as claimed in claim 5, comprising:

in a first phase, inputting an effective voltage signal to the first scanning line, inputting an ineffective voltage signal to the second scanning line, so as to enable the driving control circuit to control one of the first driving circuit and the second driving circuit to be turned on;

in a second phase, inputting an ineffective voltage signal to the first scanning line and the second scanning line, and keeping by the driving control circuit one of the first driving circuit and the second driving circuit being turned on, so as to drive the light emitting circuit to emit light;

in a third phase, inputting an effective voltage signal to the second scanning line, inputting an ineffective voltage signal to the first scanning line, so as to enable the driving control circuit to control the other of the first driving circuit and the second driving circuit to be turned on; and in a fourth phase, inputting an ineffective voltage signal to the first scanning line and the second scanning line, and keeping by the driving control circuit the other of the first driving circuit and the second driving circuit being turned on, so as to drive the light emitting circuit to emit light.

13. The pixel circuit according to claim 5, wherein the first scanning line and the second scanning line output an effective voltage signal alternately.

14. The pixel circuit according to claim 5, wherein the first driving circuit comprises a first driving transistor, a gate of the first driving transistor being coupled to the first node, a first terminal of the first driving transistor being coupled to the second voltage signal terminal, and a second terminal of the first driving transistor being coupled to the light emitting circuit.

15. The pixel circuit according to claim 5, wherein the second driving circuit comprises a second driving transistor, a gate of the second driving transistor being coupled to the second node, a first terminal of the second driving transistor being coupled to the second voltage signal terminal, and a second terminal of the second driving transistor being coupled to the light emitting circuit.

* * * * *